United States Patent [19]

Temple et al.

[11] Patent Number: 4,951,604
[45] Date of Patent: Aug. 28, 1990

[54] SYSTEM AND METHOD FOR VACUUM DEPOSITION OF THIN FILMS

[75] Inventors: Michael D. Temple; Richard I. Seddon, both of Santa Rosa, Calif.

[73] Assignee: Optical Coating Laboratory, Inc., Santa Rosa, Calif.

[21] Appl. No.: 312,527

[22] Filed: Feb. 17, 1989

[51] Int. Cl.$^5$ .......................................... C23C 16/50
[52] U.S. Cl. ................................... 118/723; 118/726; 118/730; 427/38; 427/42; 427/47; 427/255.1; 427/255.2; 427/255.7
[58] Field of Search ..................... 118/719, 723, , 726, 118/727, 728, 730; 204/192.31, 298 PI; 427/35, 38, 39, 42, 47, 255.1, 255.2, 255.7

[56] References Cited

U.S. PATENT DOCUMENTS

| | | |
|---|---|---|
| 3,984,581 | 10/1976 | Dobler et al. . |
| 4,147,573 | 4/1979 | Morimoto ..................... 204/298 PI |
| 4,197,814 | 4/1980 | Takagi et al. ........................ 118/726 |
| 4,217,855 | 8/1980 | Takagi ................................. 118/723 |
| 4,361,114 | 11/1982 | Gurev . |
| 4,448,802 | 5/1984 | Buhl et al. . |
| 4,461,689 | 7/1984 | Diepers . |
| 4,526,132 | 7/1985 | Ohta . |
| 4,619,748 | 10/1986 | Moll et al. . |
| 4,676,194 | 6/1987 | Satou . |
| 4,683,149 | 7/1987 | Suzuki et al. . |
| 4,707,238 | 11/1987 | Okubo . |
| 4,777,908 | 10/1988 | Temple et al. . |
| 4,805,555 | 2/1989 | Itoh ..................................... 118/723 |
| 4,828,870 | 5/1989 | Ando et al. ........................... 427/38 |

FOREIGN PATENT DOCUMENTS

| | | |
|---|---|---|
| 0064288 | 4/1982 | European Pat. Off. . |
| 2624005 | 12/1977 | Fed. Rep. of Germany . |
| 0135216 | 4/1979 | Fed. Rep. of Germany . |
| 0140057 | 2/1980 | Fed. Rep. of Germany . |
| 0081790 | 7/1976 | Japan . |
| 0100988 | 8/1979 | Japan . |
| 0011127 | 1/1980 | Japan . |
| 58-110030 | 6/1983 | Japan ................... 118/726 |
| 60-262964 | 12/1985 | Japan ................... 118/723 |
| 61-24214 | 2/1986 | Japan ................... 118/726 |

OTHER PUBLICATIONS

Pulker et al., "Optical and Mechanical Properties of Ion Plated Oxide Films", pp. 299-306.
Berry et al., "Thin Film Technology", pp. 139-142.
Bunshah et al., "Deposition Technologies for Films and Coatings, Developments and Applications", pp. 102-104.

Primary Examiner—Richard Bueker
Assistant Examiner—Terry J. Owens
Attorney, Agent, or Firm—Philip A. Dalton

[57] ABSTRACT

A vacuum evaporation plasma plating system is disclosed in which the plasma and the crucible containing the evaporant material are part of an electrical circuit which effects vacuum evaporation operation. The crucible includes a constant anode cap which is heated by the plasma and thus maintains a low resistance circuit path to the crucible and also provides a uniform source of evaporant.

16 Claims, 3 Drawing Sheets

SYSTEM AND METHOD FOR VACUUM DEPOSITION OF THIN FILMS

BACKGROUND OF THE INVENTION

A. Field of the Invention

This invention relates to vacuum deposition apparatus and methods, to apparatus and methods for the plasma plating of thin film materials, and to the vacuum evaporation of a source material for deposition on a substrate, alone or in combination with gaseous reactants.

B. Description of Related Art

1. FIG. 1

German published patent application No. 2,624,005 dated Dec. 8, 1977 describes a thin film deposition process called ion plating. The described system combines an electron gun evaporation system with a gas discharge system so that the evaporated material from the crucible and the ambient gas within the chamber are ionized in the region between the crucible and the substrate on which the material is being deposited.

Specifically, and referring to FIG. 1, vacuum chamber 1 is connected via port 2 to a vacuum pump (not shown). Water-cooled crucible 3 contains coating material 4. Substrate 5 is attached to a substrate holder 6 which extends through an insulated bushing 7 and is connected to a high voltage source 8. Electron gun 9 generates an electron beam 10 which is directed by a capacitor or electromagnet deflector system 11 towards the source material 4. The crucible 3 and the electron gun 9 may form a single unit. The crucible 3 is connected to the positive terminal of the voltage source 8, possibly via a bushing 12; it may also be earthed.

For operation, the vessel is evacuated to a pressure of approximately $10^{-5}$ torr. Then the electron gun 9 is switched on and the material 4 is heated by the electron beam 10. When the high voltage source 8 is switched on, a gas discharge forms inside the vessel 1, the extent of which discharge is indicated by the broken line 13. The evaporated material from the crucible 3 is ionized in the gas discharge 13 in the space between the crucible and the substrate 5, so that ions 14 of the material 4 bombard the substrate. In order for the gas discharge to be able to form at low pressures of $10^{-5}$ torr, an additional ion-producing device, a high-frequency coil 15, is located between the crucible 3 and the substrate 5, and connected to a high-frequency voltage source 16 throughout the coating process.

The above system described is thought to suffer several disadvantages. First, the application of a high d.c. voltage to the substrate holder 6 limits the usefulness of the system to conductive substrates and conductive coating materials. Dielectric materials may possibly be coated but at low rates; conditions at the substrate will change significantly as the insulating coating builds up. Even with conductive coatings there is a possibility that ion bombardment from a high applied voltage may cause atomic level damage to the substrate or film. Secondly, the use of an r.f. coil to activate both the evaporant and the background gases also limits the versatility of the system. Activation of background gas and source material cannot be independently controlled and in fact, the low recommended background gas pressure of $10^{-5}$ Torr may seriously limit the number of gas ions which can be produced. Thirdly, the requirement for r.f. energy inside the chamber significantly complicates the coating process. In addition to costing more than d.c. systems, r.f. tends to cause arcing which can affect the quality of the films produced.

2. FIG. 2

U.S. Pat. No. 4,448,802, issued May 15, 1984, discloses several embodiments of systems which combine an electron gun evaporation system with a high current, low voltage source of electrons. In each of the embodiments shown in the '802 patent, definite geometric relationships between the high voltage electron beam and the low voltage electron beam are specified. These geometric relationships restrict the relative placement of these components of this system.

FIG. 2 of the drawings illustrates a version of the '802 system thought to be offered commercially by the assignee of the '802 patent. Vacuum coating chamber 21 has a low voltage, high current source 22 mounted in one side thereof, so that associated low voltage electron beam 23 will have part of its path to the crucible 24 in common with the path of high voltage electron beam 25 emanating from electron gun 26. The holder or rack 27 is not connected in a high voltage circuit, in contrast to the above-discussed '005 publication; instead the low voltage arc discharge 23 is formed between the low voltage source 22 and the crucible 24.

In the apparatus shown in FIG. 2 and discussed in the '802 patent, the low voltage source 22 is arranged so that the magnetic field guiding the high voltage beam 25 also serves to guide the beam of electrons from the low voltage arc discharge 23. This restricts the geometric arrangement and positioning among the electron gun arrangement 26, the crucible 24, and the low voltage electron source 22. Inherent in these geometric restrictions is the requirement that the vacuum chamber 21 be specially designed for the incorporation of the low voltage electron source 22. This makes this technology less readily adaptable to standard vacuum coating chambers and makes it difficult to retrofit existing coating chambers with this new technology approach.

In this arrangement, a reactive gas is injected directly into the vacuum chamber to be ionized in the low voltage arc discharge within the vacuum chamber.

The system of FIG. 2 is thought to be limited to coating using conductive precursor materials; dielectric materials would coat the crucible 24 and quickly alter or even eliminate the requisite low resistance bias circuit connection between the plasma 23 and crucible 24. That is, after only brief periods of dielectric coating operation, dielectric material would form on the crucible, insulating the plasma from the crucible, or at least substantially increasing and varying the resistance of the plasma-to-crucible connection at the surface of the crucible. As a result, it would become impossible for the associated bias supply to maintain the required current through the system.

3. Summary of Certain Important Shortcomings of the Prior Art Systems

The inability of relevant prior art systems to form dielectric coatings is discussed above separately relative to FIGS. 1 and 2.

Another shortcoming which limits the effectiveness and versatility of typical prior art vacuum evaporation plasma plating systems is their operational sensitivity to the evaporation characteristics of the source material. Specifically, uniform, reproducible plasma plating operation of typical prior art systems requires that the source material form a molten pool which evaporates uniformly. Effective thin film plasma plating can be impaired or made impossible when the source material has a non-ideal melting or non-melting properties. For example, materials which melt or evaporates unevenly or at a non-constant rate or with directional anisotropy, or materials such as fluorides or sulfides which sublime, not melt, can be coated only with difficulty or not at all.

SUMMARY OF THE INVENTION

A. Objects

It is a principal object of the present invention to provide an improved system and method of plasma coating using dielectric coating materials.

It is another object of this invention to provide a system and method for combining a low voltage, high current plasma source and a high voltage electron beam evaporation source with a conductive crucible adapted for effecting controlled, reproducible plasma plating of dielectric materials.

It is yet another object of this invention to provide an improved plasma evaporation system and method in which dielectric source material is contained in a crucible which is part of an electrical circuit that includes the plasma and uniquely co-acts with the plasma such that plasma heating of the crucible preserves the integrity of the electrical circuit and, as a consequence, maintains effective, continuous plating operation of the system.

It is another object of the present invention to provide such a system and method employing a capped crucible which provides a uniform distribution of evaporant, substantially independent of any non-ideal, non-uniform melting characteristics of the source material, including materials which sublime, rather than melt.

It is another object of this invention to provide an improved system and method for combining a high voltage electron beam evaporation source arrangement with a low voltage, high current plasma source.

It is another object of this invention to provide a system for vacuum evaporation which combines a high voltage electron beam evaporation source and a low voltage, high current plasma source with substantial freedom in positioning of the low voltage plasma source relative to the crucible and high voltage electron beam source.

It is another object of this invention to provide an improved ion plating system in which the low voltage, high current plasma source can be readily retrofit to a standard coating chamber in which an electron beam evaporation source is already provided.

It is another object of this invention to provide a system for vacuum evaporation which combines a high voltage electron beam evaporation source and a low voltage, high current plasma source in such a way that evaporant material and additive gases are ionized in substantially independent plasmas, so that the relative degrees of ionization can be adjusted for optimum deposited film properties.

B. Apparatus Features

In one aspect, the present invention is an improvement of the plasma plating system disclosed in our U.S. Pat. No. 4,777,908 for effecting vacuum evaporation of material onto a substrate. The system disclosed in our U.S. Pat. No. 4,777,908, which is incorporated by reference, includes a vacuum chamber, an arrangement for evacuating the chamber, a substrate holder mounted within the chamber, and a crucible or container for source material. A high voltage electron beam source is positioned within the chamber in the vicinity of the crucible and includes a high voltage electron gun and a deflection magnet system arranged for bending electrons from the gun into the crucible for evaporating the source material. The magnet system forms a magnetic field in the region above the crucible as part of the guiding of the high voltage electron beam into the crucible for evaporation purposes.

According to one aspect of the present invention, a constant anode source material container is used, preferably a conductive crucible having an apertured cone-shaped cap, which is positioned within the vacuum chamber and is electrically insulated therefrom but with a low electrical resistance connection therebetween. The source material can be an electrical insulating material or an insulator-forming material, for evaporation via the orifice onto substrates in the vacuum chamber. The crucible cap is formed of high temperature material which can withstand the temperature required to evaporate the source material.

Also, a low voltage, high current plasma source communicates into the chamber and produces an intense primary plasma of a selected activation gas species for injection into and distribution within the chamber at any convenient location relative to the crucible and the electron beam source. The low voltage plasma source is electrically connected with the crucible for current flow therebetween, and fills the chamber with a generally distributed plasma. The distributed plasma co-acts with the magnetic field above the crucible and the evaporant material leaving the crucible to form an intense second plasma in the region above the crucible and extending into the crucible underneath the cap. The intense second plasma ionizes evaporant atoms, activating the evaporant material passing through the orifice in the plasma region toward the substrate and causes the orifice to act as a uniform source of evaporant material despite any non-uniform melting characteristics or non-melting evaporation characteristics thereof.

The intense plasma at the low voltage plasma source is electrically connected in turn to the distributed plasma, the intense second plasma and to the cap and crucible, with external circuit connections completing a current loop for low voltage electrons back to the low voltage plasma source. In addition to providing a uniform source at the orifice as described above, the cap is heated by low voltage electrons from the low voltage plasma source and, thus, is maintained clean and free of the build-up of evaporant material which could otherwise interrupt the low resistance current return path for the low voltage electrons and render inconsistent or terminate the plating process.

Our constant anode, capped system retains the various advantages of the referenced '908 patent. Thus, in the case in which the activation gas is reactive with the evaporant material, the deposited thin film has constituents of both the evaporant and the reactive gas species. In both the case of activated evaporation (no reaction between the additive gas species and the evaporant) and activated reactive evaporation (chemical reaction between the additive gas species and the evaporant) the deposited thin film has improved thin film characteristics.

Secondly, the interconnection of the two relatively intense plasmas by the distributed plasma frees the high voltage electron beam source, the low voltage plasma source and the crucible from geometry-imposed positioning constants. For example, the low voltage plasma source can be positioned substantially anywhere within the vacuum chamber. One preferred mounting location is at the bottom wall of the vacuum chamber where it is convenient for servicing and where it is convenient to place it for retrofitting existing vacuum chambers to achieve the significant advantages of the plasma plating technology of this invention. The combination of the elimination of restrictive geometric relative position constraints as shown in the prior art systems also provides more effective operation of the plasma plating system.

Third, by introducing the additive gas in the plasma generation region of the low voltage source, strong ionization of the selected gas species is provided. This ionization is decoupled from the ionization of the evaporant coming from the source crucible such that there is no defined arc discharge between the low voltage source and the crucible. The combination of tailoring the magnetic field from the deflection magnet system of the high voltage source with the creation of a generalized plasma in the chamber from the low voltage source permits high ionization potential to be achieved above the crucible for effective ionization of the evaporant species passing through this strong secondary plasma region. Between the intense primary plasma region and the intense secondary plasma region, the diffuse plasma provides the overall general electron current capability for the overall flow of current.

Fourth, in the system of this invention, it is preferable that the deflection magnet system for the high voltage electron source comprise a pair of magnet pole pieces arranged on opposite sides of the electron gun and shaped to provide a more narrow pole gap and accompanying higher magnetic field strength in the region of the electron gun whereat the electrons are emitted. A wider pole gap and accompanying lower magnetic field strength is provided in the region adjacent and above the crucible to increase the number of electrons that are withdrawn from the plasma to the crucible in the secondary plasma region. This increases the ionization efficiency in the secondary plasma region due to more low voltage electrons spiralling through the magnetic field before being collected on the crucible.

Another advantage disclosed in the incorporated '908 patent which is applicable to the present invention involves an improved low voltage plasma source in which a first chamber is provided with a triangular arrangement of three separate filaments mounted therein with separate electrical biasing arrangements for heating the filaments along with an arrangement for communicating a noble gas into this first chamber for plasma activation by electrons from the heated filaments. A second chamber communicates with the first chamber through a small aperture and includes means for communicating the selected activation gas species into the second chamber and an electromagnet means surrounding the second chamber for creating a magnetic field therewithin to produce a plasma generating region within the second chamber. An intense plasma of the selected activation gas species is formed in the second chamber and is then communicated into the vacuum chamber to form a generally distributed plasma.

C. Process Aspects

This invention is also an improvement of the plasma plating process disclosed in incorporated U.S. Pat. No. 4,777,908 and features a method for depositing thin film coatings, including electrical insulators such as thin film dielectric coatings. The method includes the steps of disposing a substrate in a vacuum chamber and disposing in the vacuum chamber a source of evaporant material within an electrically-conducting container having a high temperature conductive cap thereon having a source-defining opening in line of sight between the source material and the substrate. An intense plasma of a selected gas species is generated in at least one separate chamber in communication with the vacuum chamber to fill the vacuum chamber with a generally distributed plasma. The intense plasma, the container cap and the container are coupled in an electrical circuit for current flow therebetween, both through the distributed plasma within the vacuum chamber and through circuit connections outside the vacuum chamber.

A magnetic field of pre-configured characteristics is created in the region above the chamber and is used to direct a high voltage electron beam into the chamber, heating the source of evaporant material to evaporate the same. Also, the magnetic field co-acts with the distributed plasma and the evaporant material leaving the crucible to form an intense second plasma region in the magnetic field above the chamber and extending through the opening into the chamber, thereby activating the evaporant material for directed deposition on the substrate. The second intense plasma increases the current between the low voltage source and the crucible by approximately one order of magnitude or more, and also enables the aperture to act as a uniform source of the evaporant.

In addition to providing a uniform source at the orifice as described above, the cap is heated, apparently primarily by the low voltage electrons associated with the low voltage plasma, and consequently has essentially a zero sticking coefficient for the evaporant material. As a result, the cap remains clean, i.e., devoid of the build-up of evaporant material which would interrupt the low resistant current path to the crucible and thereby hinder or terminate the plating process. Instead, the electrical circuit for current flow of the low voltage electrons remains intact through the hot, clean cap/anode and the plating process is able to continue unhindered despite the use of dielectric or dielectric-forming source materials.

Other objects, features and advantages will be apparent from a consideration of the Detailed Description given below in conjunction with the accompany drawings.

BRIEF DESCRIPTION OF THE DRAWINGS

The above and other aspects of the present invention are described below with reference to the following drawing figures in which.

DETAILED DESCRIPTION OF THE PREFERRED EMBODIMENT

A. Overview of Structure and Operation

Figure 3:
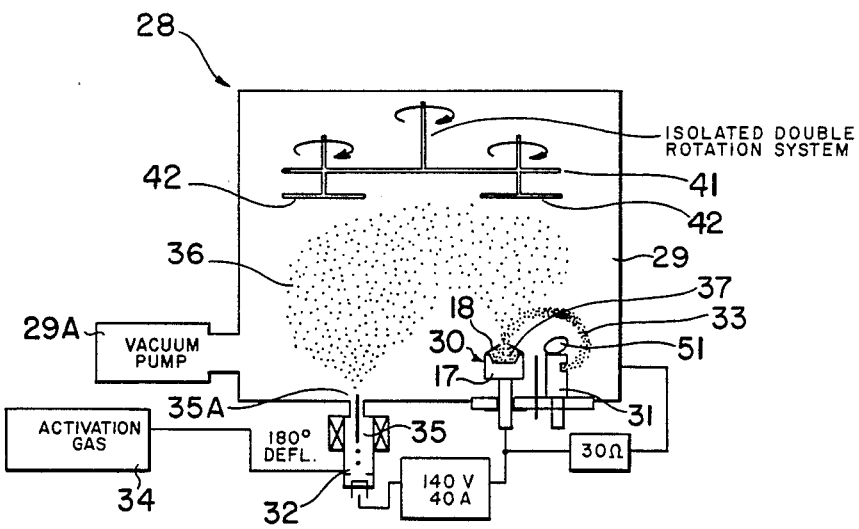
FIG. 3 is a schematic illustration of a preferred embodiment of a plasma plating system and method of this invention.

FIG. 3 is a schematic illustration of a plasma plating system 28 which embodies the present invention. Specifically, system 28 comprises a vacuum chamber 29 in which substrates 42 are positioned, typically on a double rotational mounting system 41 located in the top of chamber 29. A rotating, capped, constant anode crucible 30, a high voltage electron beam gun 31 and a low voltage plasma source 32 are mounted within the vacuum chamber 29. Crucible 30 and high voltage electron gun arrangement 31 are mounted in the bottom of chamber 29 in a normal fashion. A vacuum pump 29A communicates with the processing chamber 29 for maintaining the requisite pressure level therein for processing.

Figure 4:
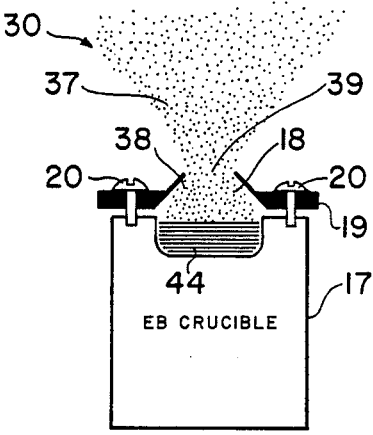
FIG. 4 is a schematic illustration of a presently preferred embodiment of a capped constant anode crucible according to the present invention.

Referring further to FIG. 3 and also to FIG. 4, in a presently preferred embodiment, the crucible assembly 30 includes a container 17 that rotates about its vertical axis and a high temperature electrically conductive crucible cap 18 mounted thereon and having an opening 39 through which the evaporated source material 44 is emitted into the chamber 29. As discussed at length below, this special constant anode crucible 30 overcomes the problems inherent to plasma plating of dielectric films on substrates and adapts the system 28 to convenient, reproducible plasma plating of dielectrics within chamber 29.

A pair of generally parallel deflection magnets 51 are mounted on the high voltage electron beam gun 31 for directing the beam 33 through a 270° arc into the crucible 30 (one magnet pole piece 51 is depicted schematically in FIG. 3). The system and operation of the standard magnetic focusing arrangement are discussed in detail in the incorporated '908 patent.

The 270 degree deflection system shown in FIG. 3 is preferred, but the invention could also employ other deflection systems such as a 90 degree deflection system.

During operation, initially the low voltage, high current source arrangement 32 is turned on and produces an intense plasma of a selected additive gas 34 such as oxygen or nitrogen (also called an activation gas) which is communicated into a plasma generating chamber region 35 associated with the low voltage source. The intense plasma in the plasma generating chamber region 35 is communicated through port 35A and gradually communicates throughout the interior of the vacuum chamber 29, forming a generally distributed plasma 36 within the vacuum chamber.

Turning on the electron gun 31 and associated focusing magnets directs a beam 33 of high energy electrons from the gun through aperture 39 into the crucible 30, heating the source material 44 so that the material begins to evaporate from the crucible 30. The electrical resistance in the region 37 above the crucible gradually decreases as the temperature increases and the evaporation rate from the crucible increases. The higher localized vapor pressure in the region 37 increases the ionization efficiency in that region. Furthermore, a portion of the magnetic field from the deflection system for the high voltage electron beam 33 produces spiralling of the electrons from the generalized plasma 36 within the chamber toward the crucible 30 so that an intense second plasma is generated in the region 37 above the crucible and extending into the interior 38 of the crucible above the source material 44. With the formation of this second plasma in region 37-38, the current between the crucible 30 and the low voltage source 32 increases, typically an order of magnitude or greater, e.g., from two or three amperes to between twenty and one hundred amperes. However, even with this increase in current, there is no defined arc discharge path between the low voltage plasma source 32 and the crucible 30 through the general plasma region within the vacuum chamber 29.

Although the overall operation of a system of this type is difficult to describe accurately from a theoretical standpoint, it appears that the most likely explanation is that the low voltage plasma source 32 is decoupled from the secondary plasma region 37-38 through the generalized plasma cloud 36 dispersed throughout the interior of the vacuum chamber 29. Electrons and activated gas molecules are ejected from the low voltage source 32 into the chamber to form the plasma cloud of electrons and ionized gas molecules. Then in the second plasma region 37-38, separate mechanisms are operating to withdraw electrons from the distributed plasma at a high rate through a region of low electrical resistance to create a high current flow.

The system of this invention like other ion plating systems in the prior art, can be employed to evaporate metal onto substrates to produce thin metal films without altering the chemical composition of the metal. In this case the additive gas is a gas species which does not react with the vaporized metal particles prior to deposition thereon on the substrate. In addition, and uniquely, the system and method of this invention may also be employed to form dielectric films on substrates within the chamber. In this case the source material is preferably the metal species or, where metal oxides are concerned, a partially oxidized source material and the activation gas would be selected to be oxygen for forming metal oxide films or nitrogen for forming metal nitride films.

B. Construction and Operation of Crucible

Figure 1:
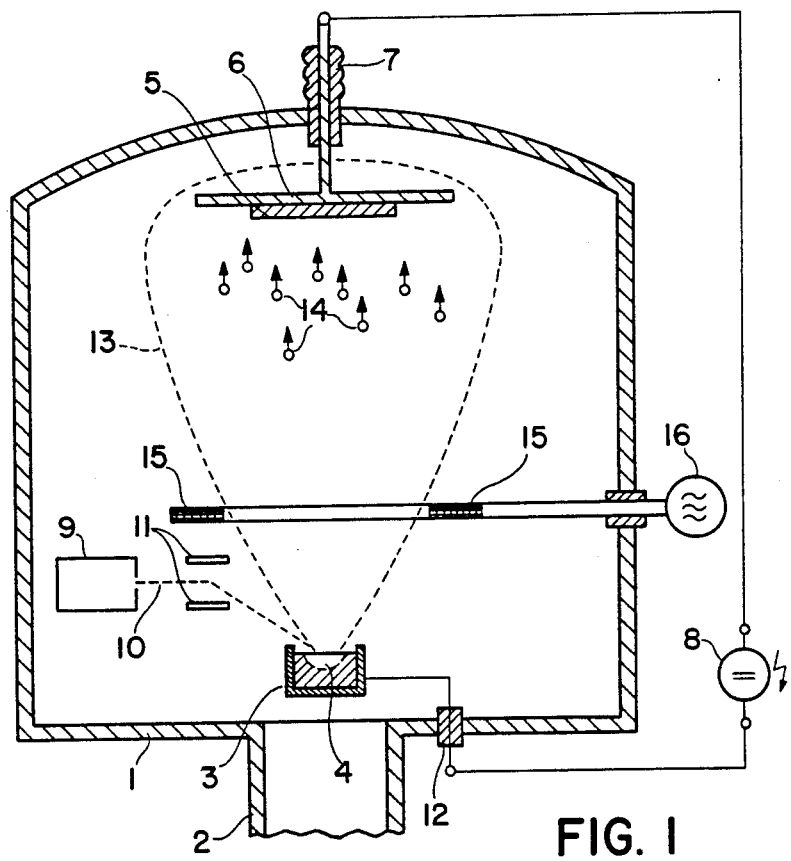
FIGS. 1 and 2 are schematic illustrations of prior art plasma plating systems.
Figure 2:
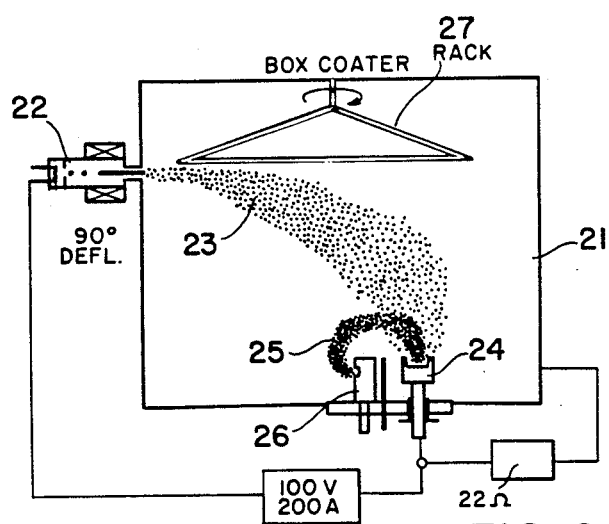

As mentioned previously, to our knowledge the prior art vacuum evaporation plasma plating systems, such as those shown in FIGS. 1 and 2, are incapable of effectively forming dielectric thin film coatings.

Figure 5:
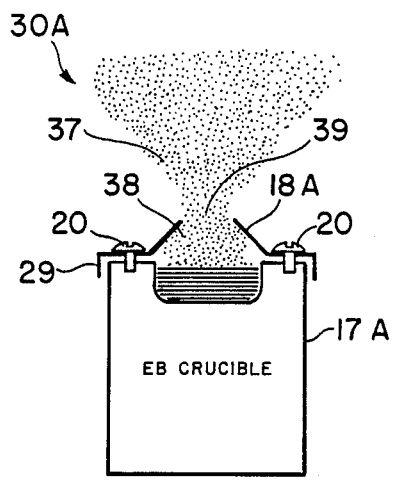
FIG. 5 is an alternative embodiment of a capped constant anode crucible embodying the principles of the present invention.

FIGS. 4 and 5 show two embodiments of our capped, "constant anode" crucible which adapts the associated plasma plating system 28, FIG. 3, for the plasma plating of dielectric materials. Please note, as used here, the phrase "constant anode" crucible refers to the crucible's construction and operation which prevent the build-up of dielectric coatings and preserve the low resistance electrical connection between the crucible and the plasma.

Referring initially to FIG. 4, in the preferred embodiment, the crucible 30 includes the high temperature, electrically conductive container 17 which holds the plasma plating source material 44. The conical-shaped cap 18 formed of refractory electrically conductive materials is secured to the top of container 17 by a clamp ring or collar 19 which is attached to the container, as by screws 20. The collar 19 is high melting point material which also is highly resistant to corrosion in high temperature plasma environments. Opening 39 is formed in the top of the cap to permit focusing the high voltage electron beam from gun 31 into the crucible and to permit the emission of evaporant from the source material.

Referring to FIG. 5, there is shown an alternative version of our capped crucible, which is designated by the reference numeral 30A. This embodiment comprises a flanged container body 17A. The conical-or domed-shaped cap 18A is mounted, as by screws 20, to the flange 29.

The clamp ring version 30 of the crucible, FIG. 4, is preferred, because the thermal mass and conduction of the clamp ring keeps the periphery of the clamp relatively cool during operation, greatly decreasing warping.

The capped, constant anode configuration shown in FIGS. 4 and 5 has several operational advantages over standard crucibles. First and of primary importance, during vacuum evaporation of dielectric thin films, dielectric material does not form on the cap. It is observed that the cap is heated during plasma operation and it is thought that this heating is effected primarily by low voltage electrons from the low voltage plasma source 32 which spiral down the magnetic field generated by magnet arrangement 51 associated with the high voltage electron beam from gun 31 and, secondarily, by electrons from the gun 31. The heated cap surface has substantially a zero sticking co-efficient for the evaporant material. Consequently, the surface of the cap is kept clean (i.e., free of the build-up of dielectric material) and the low resistance electron circuit path to the cap and the crucible is maintained.

The capped, constant anode crucible also enhances the uniformity of the evaporation of the source material and acts as a uniform source of evaporant and, thus, improves and extends the operational capability of the plasma plating system. As alluded to previously, during operation the second plasma extends via the orifice 39 into the relatively confined region 38 underneath the cap inside the crucible. The resulting intense, high pressure plasma is distributed throughout the volume of the chamber, facilitating uniform evaporation of the source material 44 across substantially the entire surface area thereof and not just in the region which is struck by the electron beam 31. Also, the resultant relatively high pressure within the crucible 30 accelerates the evaporant species through the orifice 39 with the result that the orifice acts as a uniform source.

In enhancing the uniformity of evaporation and in functioning as a uniform source of the evaporant, the capped crucible permits effective, uniform, reproducible plasma plating using a wide range of source materials which have non-ideal melting characteristics. In addition, non-melting materials, such as some fluorides and sulfides, which sublime, can be used.

The intense plasma 37–38 extending into the crucible provides a low resistance path for electrons to the wall of the crucible.

In a presently preferred working embodiment, the crucible container 17 is copper, the cap 18 is tantalum and the clamp ring 19 is stainless steel. Tantalum is used for the cap instead of copper because of its higher melting temperature. A one inch diameter orifice 39 is used.

Of course, other suitable materials will occur readily to those of usual skill in the art. For example, although tungsten is somewhat more difficult to fabricate than tantalum, tungsten has a higher melting point and, thus, may be the material of choice for very high temperature applications.

Also, from our present understanding of the system, the one inch orifice diameter is critical only in that it is approximately the minimum size which will allow the high voltage electron beam to be focused without interference into the crucible.

The illustrated conical shape of the cap is not crucial, for greater or lesser degrees of concavity will work. In fact, a flat or nearly flat cap will work, but is subject to warping.

C. System Operation

The operation of the system of this invention will now be discussed using FIG. 3 in conjunction with FIG. 7. When the system is switched on and the low voltage, high current source 32 is activated, argon is bled into the filament cavity 96 and additive gas (e.g. oxygen or other reactive gas and/or a non-reactive gas such as argon) is bled in above the aperture plate 111, as described in incorporated U.S. Pat. No. 4,777,908.

Figure 7:
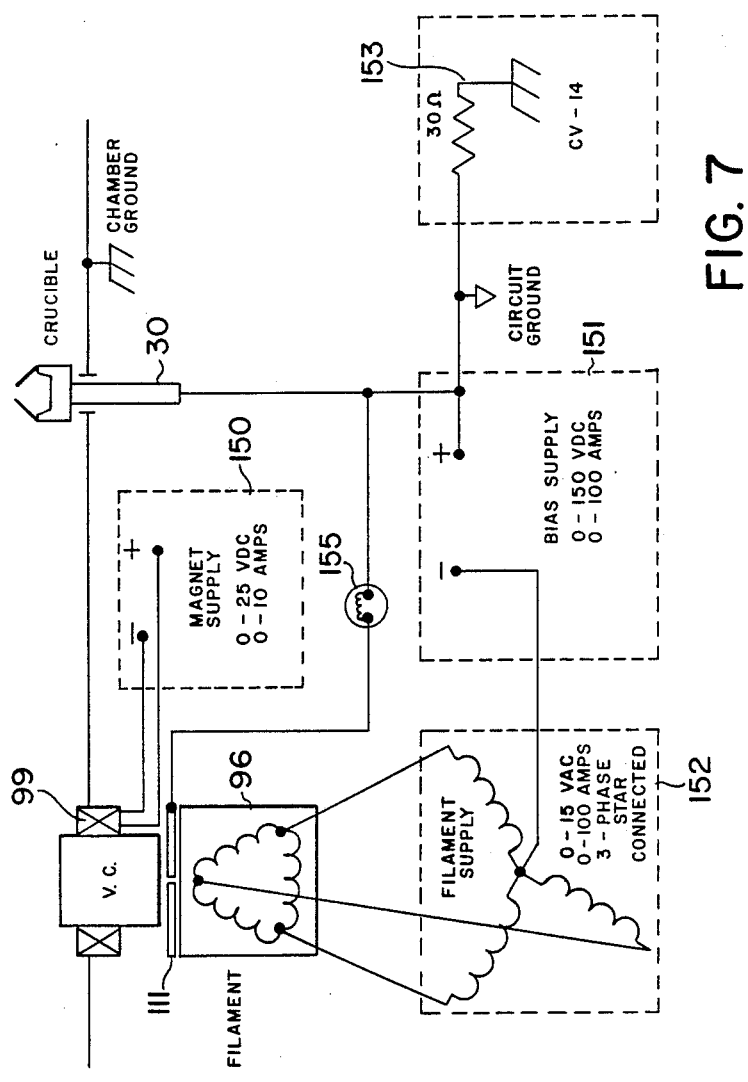
FIG. 7 is a circuit schematic diagram of the power supplies and electrical connections of a system in accordance with this invention.

The negative side of the bias supply 151, FIG. 7, is connected to the filament current supply 152 and provides DC bias for the filament network 96 of the source 32. The positive side of the bias supply is connected to the e-beam gun crucible 30, through a 30-ohm dropping resistor to chamber ground, and through an incandescent light bulb 155 to the aperture plate 111 as shown in FIG. 7. Since no current is being drawn, the chamber and the aperture plate are at bias potential relative to the filament.

Next, the high voltage electron gun 31 is turned on to burn down the source material ready for evaporation. After burndown, the filament in the gun 31 is turned down or off so that evaporation ceases, but the e-beam gun magnetic coil is left energized.

The low voltage electron source magnet 99 of source 32 is energized by magnet supply 150 and the filament bias supply 151 is turned up to heat the filaments 96. As the temperature of the filaments rises, electrons are emitted and an arc is struck from the filaments to the aperture plate 111 of the source 32.

As shown in FIG. 7, it is preferable to connect the incandescent lamp 155 between the aperture plate 111 (FIG. 7) and the circuit ground to conduct the initial current between the filaments and the aperture plate. This light bulb acts as a low resistance (virtually a dead short) during this plasma start up period. Once the arc has been struck and the current is flowing through the plasma, the resistance of the light bulb increases and drops the voltage between the filaments and the aperture plate.

The initial arc struck between the filaments 96 and the aperture plate 111 creates an intense plasma which acts as a source of electrons which can be drawn out through the aperture and which then spiral along the magnetic field of the low voltage source coil 99 to the nearest anode. At this stage in startup, the nearest anode is usually chamber ground.

A plasma forms inside the low voltage source chamber 97 within the magnet coil 99 and spreads out into the larger vacuum chamber 29, as indicated at 36, becoming more diffuse as the distance from the magnet coil increases. The magnet coil 99 is powered typically with six amperes through 1000 turns, but the current is not critical and values in the range of four to fifteen amperes provide satisfactory operation.

The e-beam gun 31 filament is then turned up so that evaporation of source material 44 begins. As the flux of evaporant increases, some of it is ionized by the e-beam gun electrons and/or electrons from the distributed chamber plasma 36. The result is the formation of a conductive plasma extending from the region 37 of the magnetic field above the e-beam gun crucible into the region 38 within the crucible 32.

As this conductive plasma extends to the fringes of the magnetic field above the crucible, it presents to the chamber plasma an anode which is more accessible than the chamber walls. Bias current increases from about 1–3 amps before source material evaporation begins, to from 30–50 amps or more with evaporation taking place.

Under operating conditions there are, therefore, three distinct plasma regions. There is an intense plasma formed in the throat of the low voltage source which is formed of electrons plus ions of argon and of the gas introduced through this source. There is an intense plasma in region 37 over the crucible and extending into the crucible interior 38 which consists of electrons plus ionized source material plus a small percentage of ionized background gas. There is a fairly uniform plasma 36 distributed throughout the chamber 29 which is approximately equipotential but which electrically connects the two intense plasmas.

Since all of the gas introduced into the chamber passes through the low voltage source chamber and all of the evaporant passes through the e-beam source plasma, there can be a very high degree of ionization of both species. The relative degree of ionization of a reactive gas and of the source material can be fine-tuned by changing the relative strengths of the two magnetic fields. However, the e-beam gun field requirement is also determined by the needs of the evaporation process. Once the e-beam gun design is fixed there may be little freedom in adjusting its magnetic field. Relative strengths of the two fields can be changed by adjusting the low voltage electron source magnet and by changing the bias voltage if required to maintain total bias current. It is believed that the intense gas plasma at the low voltage source and the ability to fine-tune the two intense plasmas account for the improved film properties seen with this system, compared with results reported by Pulker.

It should be understood that the above sequence of operations during startup is for explanation purposes. The sequence may be varied without affecting equilibrium conditions.

D. Examples

The Table below illustrates record examples of the use of our plasma plating system to coating different materials including dielectrics.

TABLE

| OPERATING EXAMPLES | | |
|---|---|---|
| Final coating Composition | ZnS | CeF$_3$ |
| Starting evaporant material | ZnS pellets | CeF$_3$ pieces |
| Electron gun voltage in kilovolts (kV) | 4.0 kV | 4.5 kV |
| Electron gun current in amperes (A) | 0.1–0.2 A | <0.1 A |
| Electron gun focus current in amperes (A) | 0.90 | 1.05 |
| Chamber starting temp. | ambient to 130° C. | ambient to 130° C. |
| Bias voltage (V) | 75 V | 75 V |
| Bias current (A) | 30–60 A | 30–60 A |
| Oxygen flow (sccm) | — | — |
| Ar flow (sccm) | 30 | 30 |
| Argon flow (sccm) | 11 | 11 |
| Chamber pressure (Torr) | $1 \times 10^{-3}$ | $1 \times 10^{-3}$ |
| Coating rate (minutes/QWOT @ 550 nm) | 1 | 1 |
| Refractive Indices | | |
| 2 μm | 2.3 | 1.6 |
| 10 μm | 2.2 | 1.53 |

E. Additional Alternative Features

In an alternative approach, a spatter shield can be temporarily inserted in the vacuum chamber beneath the crucible 30 in order to confine the plasma and the evaporant species below this position of the spatter shield. This permits the overall evaporation process to be controlled from the standpoint of starting and stopping the actual evaporation onto substrates without turning off the electron beam gun 31 or the low voltage source 32.

Figure 6:
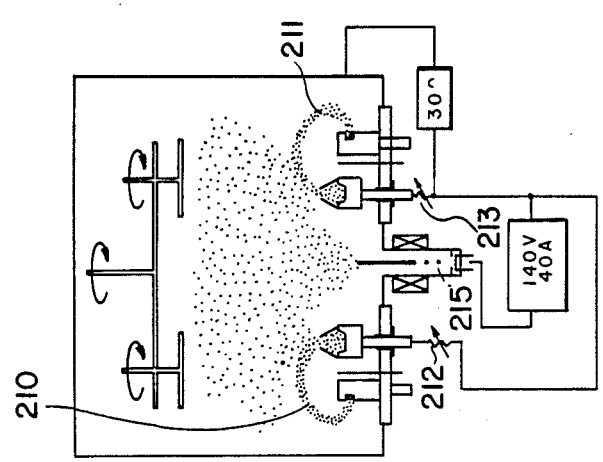
FIG. 6 illustrates an alternative, multiple crucible system.

It should be understood that this invention is not limited to the use of a single crucible and electron gun source. Instead, for producing multi-layer thin film coatings with alternating layers of different material on a substrate, a plurality of source crucibles and electron guns could be employed in a single evaporation system chamber. A double crucible and electron gun arrangement is shown in FIG. 6. In this arrangement, the source arrangements 210 and 211 can be operated sequentially to produce thin film layers of different materials on the substrate or the sources can be operated simultaneously to produce a mixture of the evaporant materials in a single thin film layer. This latter approach may be useful in forming cermet layers with one of the sources evaporating a metal and the other evaporating a dielectric material. Specifically, the dual source arrangement can be used to form mixed metal oxide layers using activated oxygen gas.

Some of the benefits of the apertured cap are provided by other heated anode structures, such as, for example, one or more resistance-heated filaments positioned on the top of the container 17. Such an arrangement would act as a low sticking coefficient, constant anode but would not provide advantages such as the uniform source effect.

Referring further to FIG. 6, variable resistors 212 and 213 may be optionally included in the circuits connecting the low voltage, high current plasma source 215 and the separate crucibles of the source arrangements. These resistors furnish a way of separately adjusting the current flow from the two separate second regions of plasma above the respective crucibles. When one electron gun is turned off, virtually all of the current will go to the crucible associated with the electron gun that is actually doing evaporation. Only small leakage current will flow in the other circuit. The variable resistors furnish an additional element of control (i.e. in addition to the e-beam current) to balance the ionization activation of evaporant from the two separate crucibles under simultaneous evaporation conditions.

What is claimed is:

1. In a vacuum chamber system for the vacuum evaporation of material from a crucible onto a substrate positioned within the chamber, and having a plasma source adapted for forming a plasma which is distributed within the chamber and is electrically connected to the crucible via the internal distributed plasma and via external circuit connections, the improvement wherein the crucible includes a container having a high temperature conductive cap thereon, said cap having an aperture for the evaporation of material from the crucible to the substrate, and whereby the container is heated by the plasma to thereby limit deposition of evaporant on the cap and to maintain the electrical connection between the plasma and the external circuit connections.

2. A system useful for vacuum evaporation of dielectric material onto a substrate, comprising:
   a vacuum chamber;
   means for evacuating said vacuum chamber;
   a substrate holder mounted within said vacuum chamber for holding at least one substrate;
   electrically conductive crucible means positioned within said vacuum chamber and comprising a conductive chamber adapted to contain a preselected source material and an outwardly extending cap covering the container, said cap having an opening for evaporation of the source material onto a substrate on the substrate holder, and said crucible being electrically insulated from said vacuum chamber but having a low electrical resistance connection therebetween;
   a high voltage electron beam source positioned within said vacuum chamber in the vicinity of said crucible and including a high voltage electron gun and a deflection magnet system arranged for bending electrons from said gun into said crucible for evaporating said pre-selected material therein, said magnet system forming a magnetic field of pre-arranged characteristics in the region above said crucible;
   a low voltage, high current plasma source, including a separate plasma generating chamber, positioned relative to said vacuum chamber to produce an intense first plasma of a selected activation gas species in said plasma generating chamber for injection into said vacuum chamber, said plasma source being positioned at any convenient location relative to said crucible and said electron beam source and being electrically interconnected with said crucible for current flow therebetween; and
   said plasma source thereby filling said vacuum chamber with a generally distributed plasma, and said distributed plasma co-acting with said magnetic field above said crucible and evaporant material leaving said crucible to form an intense second plasma in the region above and extending into said crucible, thereby activating said evaporant material passing through said region toward said substrate to produce a vacuum deposited thin film comprising said material and having improved thin film characteristics and heating said cap, keeping the cap sufficiently free of evaporant material to maintain said low electrical resistance connection between the plasma and the crucible.

3. The system of claim 2, wherein said selected activation gas species is reactive with said evaporant material, and said thin film deposited on said substrate includes a chemical combination of said evaporant material and said activation gas species.

4. The system of claim 2, wherein said substrate holder is mounted in a top region of said chamber, said crucible and said high voltage electron gun are positioned in a bottom region of said chamber and said plasma source is located adjacent a bottom region of said chamber generally in a position on one side of said crucible opposite said electron gun.

5. The system of claim 2, wherein said electron beam source is a 270° deflection type source, said deflection magnet system comprises a pair of magnet pole pieces arranged on opposite sides of said electron gun and shaped to provide a more narrow pole gap and accompanying higher magnetic field strength in the region of said electron gun whereat electrons are emitted and a wider pole gap and accompanying lower magnetic field strength in the region adjacent and above said crucible to increase the number of electrons withdrawn from the second plasma to the crucible and thereby to increase the ionization efficiency in said second plasma region.

6. The system of claim 2, further comprising:
   a second electrically conductive crucible positioned within said vacuum chamber at a location substantially remote from said first crucible, said second crucible being electrically insulated from said chamber but having a low resistance electrical connection therebetween, said second crucible being adapted to contain a pre-selected second material for evaporation onto said substrate; and
   a second high voltage electron beam source positioned within said chamber in the vicinity of said second crucible and remote from said first electron beam source to avoid interaction therebetween, said second electron beam source including a high voltage electron gun and a deflection magnet system arranged for bending electrons from said gun into said crucible for evaporating said pre-selected material therein, said magnet system forming a magnetic field of pre-arranged characteristics in the region above said second crucible;
   said second crucible being electrically connected to said low voltage, high current plasma source for current flow therebetween;
   said plasma filling said chamber co-acting with said magnetic field above said second crucible and evaporant material leaving said second crucible to form an intense second plasma in the region above said second crucible, thereby activating said evaporant material passing through said region toward said substrate and depositing thereon.

7. The system of claim 6, wherein said first and second materials are chemically different materials, and said first and second electron beam sources are operated during separate first and second time periods such that said thin film deposited during said first time period comprises said first material and said thin film deposited during said second time period comprises said second material.

8. The system of claim 6, wherein said first and second materials are chemically different materials, and said first and second electron beam sources are operated during the same time period such that said thin film deposited on said substrate comprises both said first and second materials.

9. A method suitable for vacuum depositing dielectric thin film coatings, comprising the steps of:
disposing a substrate in a vacuum chamber;
disposing in said vacuum chamber at least a first source of evaporant material within a capped constant anode electrically conducting container including a conductive cover thereon having an aperture with line of sight from said aperture to said substrate;
generating an intense plasma of a selected activation gas species in at least one separate chamber in communication with said vacuum chamber to fill said vacuum chamber with a generally distributed plasma;
coupling said intense plasma and said container in an electrical circuit for current flow therebetween both through distributed plasma within said chamber and directly through circuit connections outside said chambers;
creating a magnetic field of pre-configured characteristics in the region above said container;
generating an electron beam which is focused by said magnetic field into the container to evaporate said source of evaporant material and form an intense second plasma region in said magnetic field above said container and extending into the container, through which said evaporant material passes and is activated as it deposits on said substrate; and
whereby at least one of said plasmas within the chamber heats said cap to suppress the deposition of evaporant material thereon and thus preserve said electrical circuit.

10. A method suitable for vacuum depositing dielectric thin film coatings, comprising the steps of:
disposing a substrate in a vacuum chamber;
disposing in said vacuum chamber at least a first source of evaporant material within a capped constant anode electrically conducting container including a conductive cover thereon having an aperture with line of sight from said aperture to said substrate;
generating an intense plasma of a selected reactive activation gas species in at least one separate chamber in communication with said vacuum chamber to fill said vacuum chamber with a generally distributed plasma of said reactive activation gas species;
coupling said intense plasma and said container in an electrical circuit for current flow therebetween both through distributed plasma within said chamber and directly through circuit connections outside said chamber;
creating a magnetic field of pre-configured characteristics in the region above said container;
generating an electron beam which is focused by said magnetic field into the container to evaporate said source of evaporant material and form an intense second plasma region in said magnetic field above said container and extending into the container, through which said evaporant material passes and is activated on its way to said substrate for combining with said reactive activation gas species and depositing on said substrate as a thin film; and
whereby at least one of said plasmas within the chamber heats said cap to suppress the deposition of evaporant material thereon and thus preserve said electrical circuit.

11. The method of claim 9 or 10, wherein the selected gas species is reactive with the evaporant material, and the thin film deposited on the substrate thereby includes a chemical combination of the evaporant material and the selected activation gas species.

12. The method of claim 9 or 10, wherein the substrate is disposed in a top region of the vacuum chamber, the container for the source evaporant material is disposed in a bottom region of the vacuum chamber, the heating of the source of evaporant material is by a high voltage electron gun positioned in a bottom region of the vacuum chamber and the at least one chamber for generating the intense plasma is in communication with the vacuum chamber at a bottom region of the vacuum chamber generally in a position on one side of the container opposite the electron gun.

13. The method of claim 9 or 10, further comprising disposing in the vacuum chamber first and second containers for first and second sources of evaporant materials and providing first and second high voltage electron beam guns for heating the respective first and second sources of evaporant materials, wherein the first and second evaporant materials are chemically different materials, and further comprising the steps of operating the first and second electron beam guns during separate first and second time periods such that the thin film deposited during the first time period comprises the first material and the thin film deposited during the second time period comprises the second material.

14. The method of claim 13, wherein the substrate is disposed in the top region of the vacuum chamber, the containers for evaporant material are disposed in the bottom of the vacuum chamber, as are the associated electron beam guns, and the at least one separate chamber for generating the intense plasma is in communication with the vacuum chamber at a bottom region of the vacuum chamber in a position generally between the two containers and opposite the associated electron guns.

15. The method of claim 9 or 10, further comprising disposing in the vacuum chamber first and second sources, respectively, of first and second evaporant materials and providing first and second high voltage electron beam guns for heating the respective first and second sources of evaporant materials, wherein the first and second evaporant materials are chemically different materials, and further comprising the steps of operating the first and second electron beam guns during the same time period such that the thin film deposited on the substrate comprises both the first and second materials.

16. The method of claim 15, wherein the substrate is disposed in the top region of the vacuum chamber, the source of evaporant material are disposed in the bottom of the vacuum chamber, as are the associated electron beam guns, and the at least one separate chamber for generating the intense plasma is in communication with the vacuum chamber at a bottom region of the vacuum chamber in a position generally between the two containers and opposite the associated electron guns.

* * * * *